United States Patent
Goeke et al.

(10) Patent No.: US 9,983,228 B2
(45) Date of Patent: May 29, 2018

(54) TRIAXIAL DC-AC CONNECTION SYSTEM

(71) Applicant: Keithley Instruments, LLC, Solon, OH (US)

(72) Inventors: Wayne C. Goeke, Hudson, OH (US); Gregory Sobolewski, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 101 days.

(21) Appl. No.: 14/846,121

(22) Filed: Sep. 4, 2015

(65) Prior Publication Data
US 2016/0084878 A1    Mar. 24, 2016

Related U.S. Application Data

(60) Provisional application No. 62/054,622, filed on Sep. 24, 2014.

(51) Int. Cl.
*G01R 1/067* (2006.01)
*G01R 31/00* (2006.01)
(Continued)

(52) U.S. Cl.
CPC .......... *G01R 1/0416* (2013.01); *G01R 27/28* (2013.01); *G01R 31/24* (2013.01);
(Continued)

(58) Field of Classification Search
CPC .. G01R 1/0416; G01R 31/24; G01R 31/2889; G01R 31/2822; G01R 27/28; G01R 31/06; G01R 31/18; G01R 31/2607
(Continued)

(56) References Cited

U.S. PATENT DOCUMENTS

| | | | |
|---|---|---|---|
| 5,345,182 A * | 9/1994 | Wakamatsu | G01R 27/08 324/522 |
| 5,418,506 A | 5/1995 | Mahnad | |
| 6,998,869 B2 | 2/2006 | Tanida et al. | |
| 7,068,060 B2 | 6/2006 | Iwasaki | |

(Continued)

FOREIGN PATENT DOCUMENTS

| EP | 2589970 A2 | 5/2013 |
|---|---|---|
| EP | 2762906 A2 | 8/2014 |

OTHER PUBLICATIONS

Extended Search Report for European Patent Application No. 15186279.4, dated Feb. 15, 2016, 9 pages, Munich.

*Primary Examiner* — Giovanni Astacio-Oquendo
(74) *Attorney, Agent, or Firm* — Marger Johnson; Andrew J. Harrington

(57) ABSTRACT

Embodiments of the present invention provide an improved two-cable connection system for connecting electrical test instrumentation to a device under test (DUT). In one embodiment, a single pair of equal-length triaxial cables each has a desired characteristic impedance. Each cable has a center connecter, intermediate conductor, and outer conductor. The proximal end of each cable is connected to the test instrumentation, and the distal ends are located at the DUT. At the distal end, the center conductors are connected to the DUT, the intermediate conductors are allowed to float, and the outer conductors are connected to each other. The proximal end of each cable is connected to the device using an appropriate connection for the test that will be performed. This allows the test instrumentation to perform different types of tests without changing connections to the DUT.

13 Claims, 3 Drawing Sheets

(51) Int. Cl.
*G01R 1/04* (2006.01)
*G01R 31/28* (2006.01)
*G01R 27/28* (2006.01)
*G01R 31/24* (2006.01)
*G01R 31/06* (2006.01)
*G01R 31/18* (2006.01)
*G01R 31/26* (2014.01)

(52) U.S. Cl.
CPC ..... *G01R 31/2822* (2013.01); *G01R 31/2889* (2013.01); *G01R 31/06* (2013.01); *G01R 31/18* (2013.01); *G01R 31/2607* (2013.01)

(58) Field of Classification Search
USPC ............. 324/755.02, 500, 537, 755.01
See application file for complete search history.

(56) References Cited

U.S. PATENT DOCUMENTS

| | | | |
|---|---|---|---|
| 7,098,647 B2 | 8/2006 | Tanaka et al. | |
| 7,388,366 B2 | 6/2008 | Goeke | |
| 7,568,946 B1 | 8/2009 | Goeke | |
| 8,410,804 B1* | 4/2013 | Goeke | G01R 1/06772 324/121 R |
| 8,593,233 B1* | 11/2013 | Goeke | H01P 1/2133 333/105 |
| 2005/0237079 A1* | 10/2005 | Tanida | G01R 31/2844 324/762.01 |
| 2007/0182429 A1* | 8/2007 | Goeke | G01R 1/0416 324/755.02 |
| 2014/0218064 A1* | 8/2014 | Niemann | G01R 31/2607 324/762.09 |

* cited by examiner

TRIAXIAL DC-AC CONNECTION SYSTEM

FIELD OF INVENTION

Embodiments of the disclosed technology generally relate to electrical test instrumentation and, in particular, to interconnection systems between electrical test instrumentation and devices under test (DUTs).

BACKGROUND

It has become common to perform multiple tests in multiple regimes on semiconductor devices on a wafer, as well as at later points in a device's life, including in its final product. Examples of common tests are current-voltage (IV), capacitance-voltage (CV), general radio frequency (RF), and vector network analysis (VNA) tests. Some types of testing, such as CV, RF, and VNA testing benefit from having a control impedance between the test instrumentation and the DUT. Other types of tests however, such as IV tests, do not require such a control impedance. This can be problematic when both types of tests need to be performed.

In IV testing, it is common to use two pairs of triaxial cables (each cable having an outer, intermediate and center connector) between the test instrumentation and two pins at the DUT. At the DUT (distal) end, the center conductors of a first pair of cables are connected to one pin and the center conductors of a second pair of cables is connected to the second pin. The two intermediate conductors of each pair are typically also connected together at the distal end. In operation, the intermediate conductors are typically supplied with a guard voltage that corresponds to the voltage on the respective center conductors. The outer conductors of the triaxial cables are typically connected to a protective ground, since the intermediate and center conductor voltages may be at a high potential.

In CV testing, it is common to use two pairs of two-conductor coaxial cables between the test instrumentation and two pins at the DUT. At the distal end, the center conductors of the first pair of cables are connected to one pin, and the center conductors of the second pair of cables is connected to the second pin. The outer conductors of the cables are typically connected to an instrumentation ground.

AC tests, such as RF and VNA tests, typically require a transmission line between the instrumentation and the DUT. Prior systems use the space between the triaxial cable's center conductor and intermediate conductor as the transmission line for these tests. In order to establish this transmission line, a user must short the intermediate conductors together at the DUT. This short must then be removed before DC tests, such as IV testing, can be performed. It is inconvenient (if not outright burdensome) for the user to change connections at the DUT, particularly when performing a significant amount of both AC and DC testing. In addition, many similar connection systems may be converging into a very restricted space at the DUT, making it even more difficult and time-consuming to change the DUT connections.

Previous four-cable connection systems have been devised to allow a single DUT connection to be used for multiple tests. But no similar system has been devised for two-cable connection systems, even though two-cable systems are more desirable in some situations. Four-cable systems are only necessary when the cable resistance would affect the measurement. When the cable resistance would have a minimal effect on the measurement—for example, when performing high-voltage testing—a two-cable connection system may be more desirable. Two-cable connection systems typically cost less and take up less space than four-cable systems, which can be particularly important when there is limited space at the DUT.

U.S. Pat. No. 7,388,366 describes a four-cable connection system that can use a single connection at the DUT to perform multiple tests. As described in the patent, the four-cable system can also be used to perform two-cable tests. But, this solution requires all four cables to be used, which eliminates the advantages of a two-cable connection system. In addition, many instruments do not natively support four-cable connections. Adapters would allow the four-cable connection system to be used with these instruments, but at the cost of increased expense and complexity. Adapters also lengthen the connection between the instrumentation and the DUT, which reduces performance at higher frequencies.

One solution for two-cable connection systems is to use a switching device that changes connections at the DUT. This allows the instrumentation to use a single cable configuration when connecting to the switching device. But the switching device itself adds cost and complexity to the connection system. Manual switching devices require the user to switch between each set of DUT connections, which adds time between tests. Automated switching devices may use a processor to automatically change the DUT connections. But this adds further complexity and cost, and requires a power source for the processor.

Thus, there is a need for improved two-cable interconnection systems between test instrumentation and devices under test (DUTs).

DETAILED DESCRIPTION OF THE INVENTION

Embodiments of the disclosed technology are generally directed to interconnection systems that include a single pair of triaxial cables between a test instrumentation and a device under test (DUT). The triaxial cables may support low current IV measurements (a DC test). For AC testing (e.g., CV or VNA testing), the intermediate conductor may be allowed to float—at least at higher frequencies—such that a transmission line may be established between the center conductor and the outer conductor (shield). The intermediate conductor needs to be allowed to float for signals that have a wavelength much greater than ¼ of the cable length. Otherwise, measurements will become distorted as the test signal wavelengths approach one-fourth of the cable's length. Typically, the intermediate conductor is allowed to float for wavelengths that are a factor of 10 or 20 times longer than the cable length. The exact factor in each case is based on the desired measurement precision, with higher factors (i.e., allowing the intermediate conductor to float for longer wavelengths) giving more precision.

A connection system for connecting test instrumentation to a DUT according to embodiments of the disclosed technology generally includes first and second triaxial cables, each having a desired characteristic impedance, the proximal ends of the cables being located at the test instrumentation and the distal ends of the cables being located at the DUT.

Figure 1:
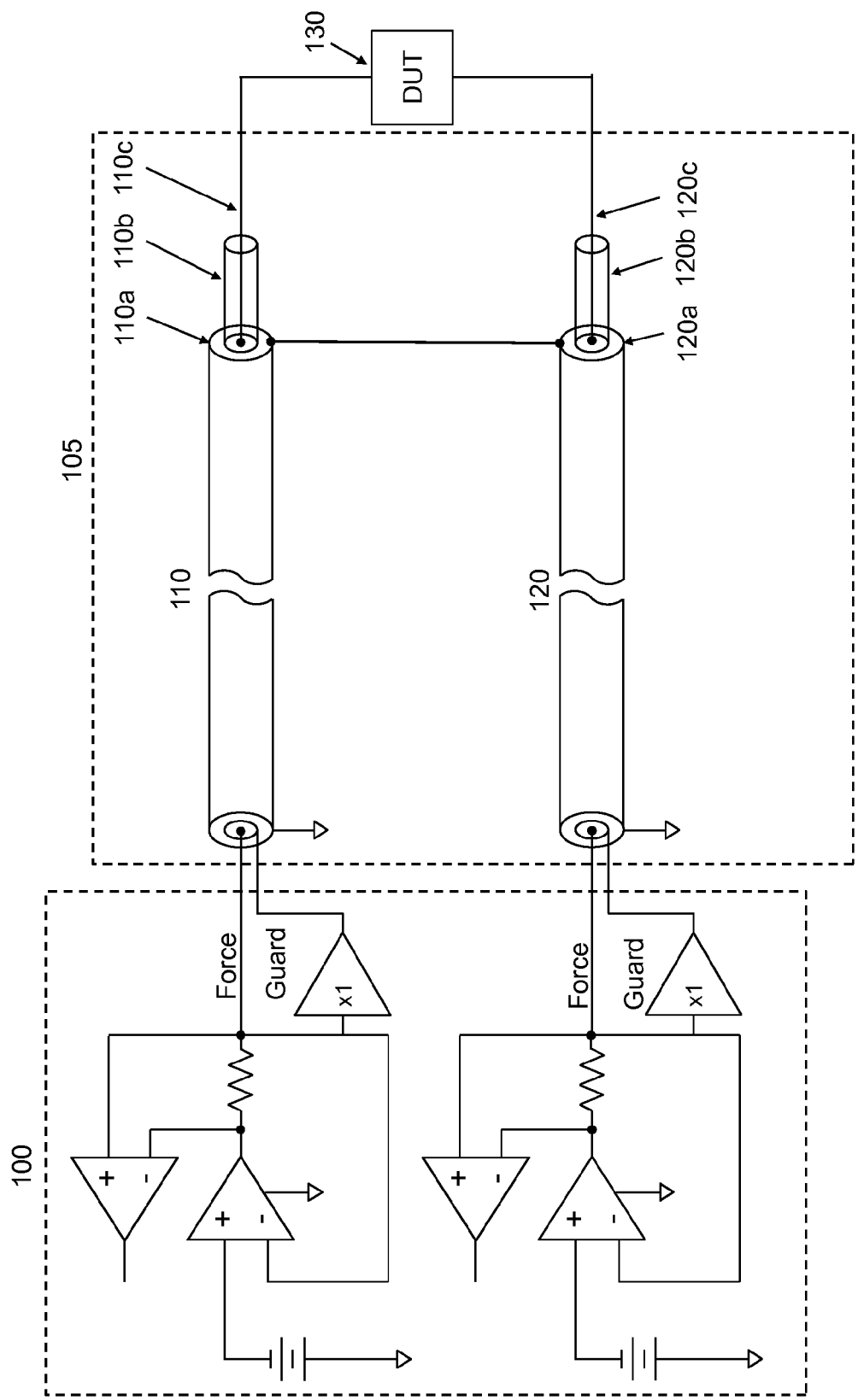
FIG. 1 depicts an exemplary embodiment of a two-cable non-Kelvin connection system for performing an IV measurement in accordance with certain aspects of the disclosed technology.

FIG. 1 depicts an exemplary embodiment of a two-cable non-Kelvin connection system 105 for performing an IV measurement in accordance with certain aspects the disclosed technology. A first triaxial cable 110 and second triaxial cable 120 connect a DUT 130 to a test instrument 100 which is configured to perform an IV test on the DUT. Each triaxial cable has a center conductor (110c, 120c), an intermediate conductor (110b, 120b), and an outer conductor (110a, 120a). The distal ends of the cables are located near the DUT 130 and the proximal ends are located at the test instrument 100. The cables may each have a characteristic impedance. For example, 50 ohms. This may be important when attaching the cables to instrumentation that requires a matched impedance to function properly. In one embodiment, cables 110 and 120 are equal lengths.

In the embodiment shown in FIG. 1, outer conductors 110a and 120a are connected together at the distal end of the cables (i.e., the end near the DUT 130). Intermediate conductors 110b and 120b are not connected to anything at the distal end, and are left free to float. Center connectors 110c and 120c are connected to the DUT 130 at the distal ends of the cables.

Figure 2:
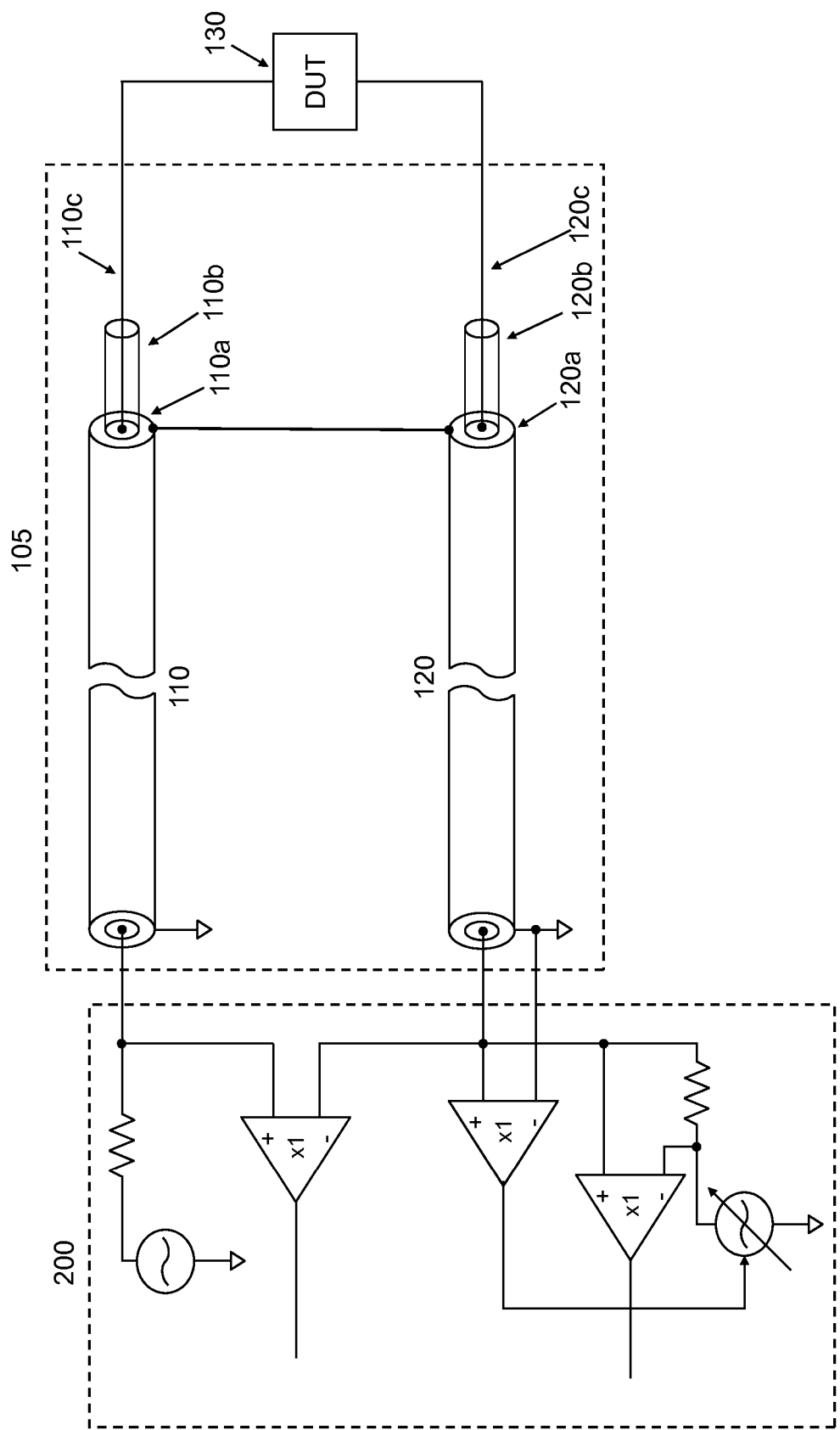
FIG. 2 depicts an exemplary embodiment of a two-cable connection system for performing a CV measurement in accordance with certain aspects the disclosed technology.
Figure 3:
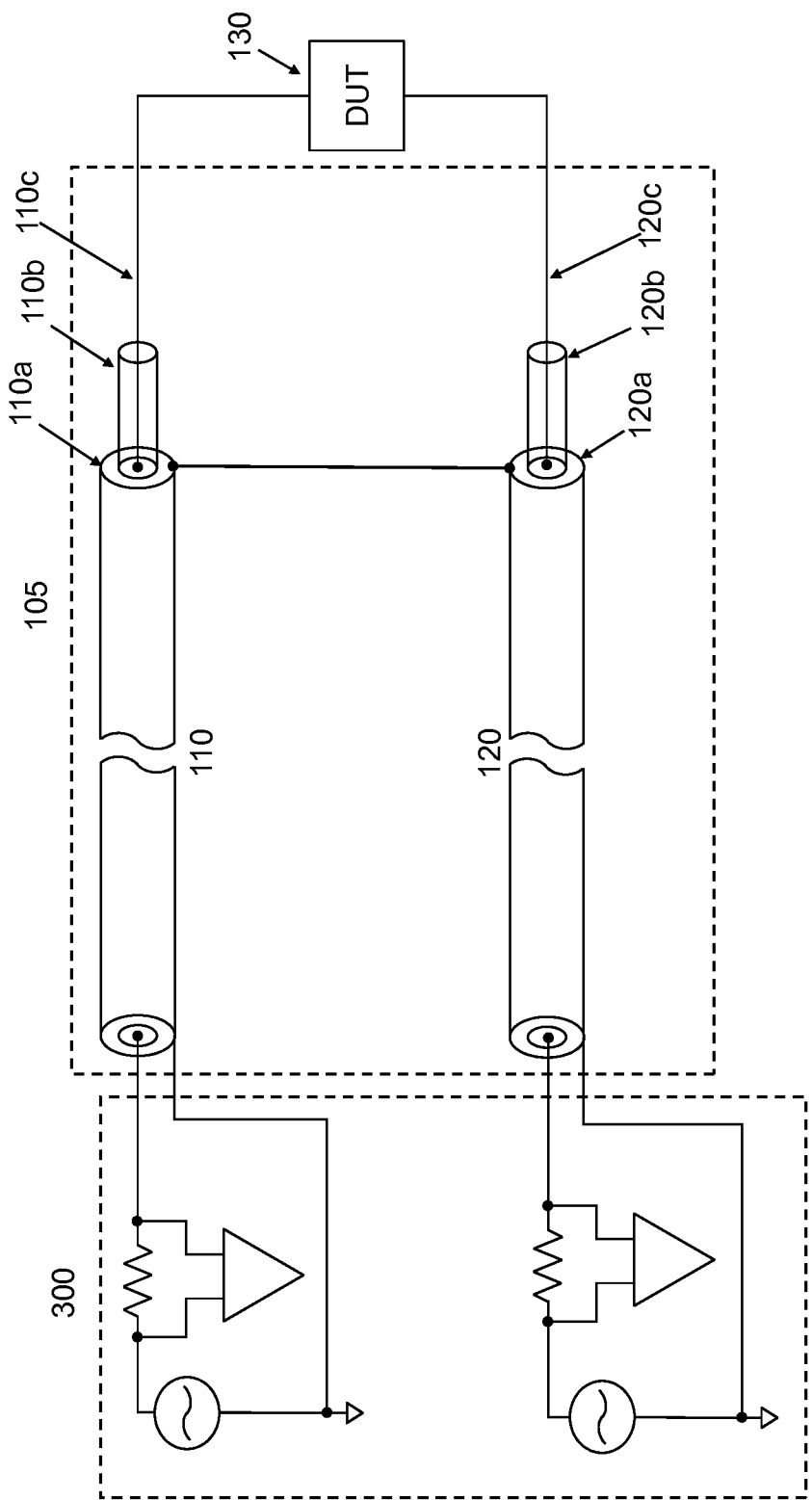
FIG. 3 depicts an exemplary embodiment of a two-cable connection system for performing VNA testing in accordance with certain aspects of the disclosed technology.

At the proximal end (near instrument 100), the cables are connected in a manner suitable for an IV test. In this example, outer conductors 110a and 120a are connected to ground. Center connectors 110c and 120c are connected to the force terminals, while intermediate conductors 110b and 120b are connected to respective guard terminals on the instrument. As shown in FIGS. 2 and 3, the same connection system 105 can be used to perform other types of tests without changing the connections to DUT 130.

FIG. 2 depicts a second exemplary embodiment of a two-cable connection system configured to perform a CV measurement (a type of AC test) in accordance with certain aspects of the disclosed technology. In the example, the same connection system 105 as in FIG. 1 is used, and retains the same connections to the DUT 130. But, the proximal end of each intermediate conductor 110b and 120b is allowed to float (at least at higher frequencies) such that a transmission line is established between each center conductor (110c, 120c) and its respective outer conductor (110a, 120a). Note that FIGS. 1-3 show exemplary circuitry within instruments 100, 200, and 300 to illustrate some possible differences between the instruments that perform each type of test. This circuitry is not intended to represent all of the circuitry in each instrument, or even all of the circuitry needed to perform each test. Furthermore, in some embodiments two or more of instruments 100, 200, and 300 may be implemented within a single device.

FIG. 3 depicts another exemplary embodiment of a two-cable connection system configured to perform VNA testing (a type of AC testing) in accordance with certain aspects of the disclosed technology. Connection system 105 and its connections to DUT 130 remain the same as in FIGS. 1 and 2. As shown in FIG. 3, however, outer conductors 110a and 120a are connected to an internal ground within instrument 300 and are not independently grounded.

Prior systems require a user to short the intermediate conductors at the DUT for CV testing and disconnect them for IV testing. In contrast, implementations of the disclosed technology advantageously allow a user to quickly and easily switch between different types of testing (e.g., IV testing and CV testing) without changing the connection at the distal ends of the cable (e.g., at the DUT). Prior systems did not provide a means to switch from IV testing (as shown in FIG. 1) to AC testing (as shown in FIGS. 2 and 3).

As shown in FIGS. 2 and 3, the intermediate conductors are normally not connected to anything at either the proximal or distal ends of the cables. This establishes a transmission path between the center and outer conductors. Some users, however, may be uncomfortable with allowing the intermediate conductors to float. Thus, in other embodiments the intermediate conductors may be connected to an electrical signal (e.g., a terminal on the instrumentation, ground, or some other signal), through a large impedance. This impedance must be much greater than the cable's characteristic impedance between the center and intermediate conductors, to avoid interfering with the transmission path in the cable. Typically, the impedance is at least ten times greater than the cable's characteristic impedance. This may degrade the cable's performance by roughly ten percent. When greater performance is desired, even larger impedances may be used. For example, using an impedance one hundred times larger than the cable's characteristic impedance may only have a 1% impact on the cable's performance.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A system configured to perform at least two different types of tests on a device under test (DUT) without changing connections at the DUT, wherein a first type of test benefits from having a control impedance between a test instrument and the DUT and a second type of test does not benefit from having a control impedance between a test instrument and the DUT, the system comprising:
   a test instrument;
   a device under test (DUT); and
   two or more triaxial cables with a distal end located near the DUT and a proximal end located near the test instrument, each cable having a center conductor, an intermediate conductor, and an outer conductor, wherein;
   the center conductors are connected to the DUT at the distal end of each cable and to the test instrument at the proximal end of each cable;
   the outer conductors are connected to each other at both the distal and proximal ends of the cables; and the outer conductors are connected to a ground that is shared with the test instrument at the proximal ends of the cables; and wherein the system is configured to perform the first type of test when the intermediate conductors are not connected to each other at the proximal ends of the cables and are not connected to the test instrument.

2. The system of claim 1, wherein the test instrument comprises a first set of terminals and a second set of terminals that is different from the first set; and the system is further configured to perform the first type of test when the cables are connected to the first set of terminals; and the system is further configured to perform the second type of test when the cables are connected to the second set of terminals.

3. The system of claim 1, wherein one or more of the intermediate conductors are further connected to an electrical signal or ground through an impedance that is at least ten times larger than the control impedance.

4. The system of claim 1, wherein the ground is an internal ground of the instrument.

5. The system of claim 1, wherein at least one of the outer conductor connections at the distal ends of the cables is made on a DUT carrier.

6. The system of claim 1, wherein each cable has a desired characteristic impedance of 50 ohms between the center conductor and the outer conductor.

7. The system of claim 1, wherein the test instrument requires that the cables have a matched impedance.

8. A system configured to perform at least two different types of tests on a device under test (DUT) without changing connections at the DUT, wherein a first type of test benefits from having a control impedance between a test instrument and the DUT and a second type of test does not, the system comprising:

a first test instrument for performing the first type of test;

a second test instrument for performing the second type of test;

a device under test (DUT); and two or more triaxial cables with a distal end located near the DUT and a proximal end located near one of the test instruments, each cable having a center conductor, an intermediate conductor, and an outer conductor, wherein;

the center conductors are connected to the DUT at the distal end of each cable;

the outer conductors are connected to each other at both the distal and proximal ends of the cables; and the outer conductors are connected to a ground that is shared with at least one of the test instruments at the proximal ends of the cables; and wherein the system is configured to perform the first type of test when;

the center conductors are connected to the first test instrument at the proximal ends of the cables;

the intermediate conductors are not connected to each other at the proximal ends of the cables; and the intermediate conductors are not connected to either of the first or second test instruments; and wherein the system is configured to perform the second type of test when the center conductors are connected to the second test instrument at the proximal ends of the cables.

9. The system of claim 8, wherein one or more of the intermediate conductors are further connected to an electrical signal or ground through an impedance that is at least ten times larger than the control impedance.

10. The system of claim 8, wherein the ground is an internal ground of the first or second instrument.

11. The system of claim 8, wherein at least one of the outer conductor connections at the distal ends of the cables is made on a DUT carrier.

12. The system of claim 8, wherein each cable has a desired characteristic impedance of 50 ohms between the center conductor and the outer conductor.

13. The system of claim 8, wherein at least one of the test instruments requires that the cables have a matched impedance.

* * * * *